United States Patent [19]

Cooledge et al.

[11] Patent Number: 4,845,475
[45] Date of Patent: Jul. 4, 1989

[54] AUTOMATIC TESTING OF POSITION SENSING DEVICES EMPLOYING STORED SENSED POSITION

[75] Inventors: Joseph T. Cooledge, Bellevue; Thanh J. Gahr, Renton, both of Wash.

[73] Assignee: The Boeing Company, Seattle, Wash.

[21] Appl. No.: 121,618

[22] Filed: Nov. 17, 1987

[51] Int. Cl.$^4$ ............................................. G08B 21/00
[52] U.S. Cl. ...................................... 340/644; 371/25; 340/514; 340/518; 324/158 SC; 364/550
[58] Field of Search ............... 340/644, 642, 575, 517, 340/518, 514, 525, 561, 562, 563, 512, 825.17; 324/418, 158 SC, 158 T, 158 D; 371/25; 307/350, 542.1, 289; 364/480, 550, 551; 361/181

[56] References Cited

U.S. PATENT DOCUMENTS

| | | | |
|---|---|---|---|
| 3,248,721 | 4/1966 | Cockrell et al. | 371/25 |
| 3,575,607 | 4/1971 | Edstrom | 340/518 |
| 3,648,233 | 3/1972 | Clark | 340/644 |
| 3,659,273 | 4/1972 | Knauft et al. | 371/29 |
| 3,668,627 | 6/1972 | Brainerd | 340/52 H |
| 3,678,344 | 7/1972 | Wedmore | 340/644 |
| 4,739,351 | 4/1988 | Feldman | 340/515 |
| 3,829,848 | 8/1974 | Eickelberg et al. | 340/825.17 |
| 3,835,466 | 9/1974 | Bieszcad et al. | 340/332 |
| 3,877,000 | 4/1975 | Kosco | 340/644 |
| 4,205,307 | 5/1980 | Liermann et al. | 340/644 |
| 4,236,149 | 11/1980 | Soyck | 340/644 |
| 4,263,580 | 4/1981 | Sato et al. | 340/644 |
| 4,340,852 | 7/1982 | Togneri | 340/644 |
| 4,398,144 | 8/1983 | Heidemann | 340/644 |
| 4,437,094 | 3/1984 | Fish | 340/644 |
| 4,456,908 | 6/1984 | Morroll et al. | 340/644 |
| 4,525,699 | 6/1985 | Buck et al. | 340/514 |
| 4,554,507 | 11/1985 | Brown | 324/158 SC |
| 4,575,718 | 3/1986 | Ludowyk | 340/644 |
| 4,588,950 | 5/1986 | Henley | 307/350 |
| 4,600,917 | 7/1986 | Seki et al. | 324/158 SC |
| 4,634,842 | 1/1987 | Payne | 340/644 |
| 4,669,061 | 5/1987 | Bhavsar | 371/25 |
| 4,762,663 | 8/1988 | Cook et al. | 324/158 R |

FOREIGN PATENT DOCUMENTS

| 1091198 | 6/1981 | U.S.S.R. | 371/29 |
|---|---|---|---|
| 0978085 | 5/1984 | U.S.S.R. | 371/29 |

*Primary Examiner*—Joseph A. Orsino
*Assistant Examiner*—Jill D. Jackson
*Attorney, Agent, or Firm*—Dellett, Smith-Hill & Bedell

[57] ABSTRACT

An automatic testing method and apparatus for proximity switches toggles a proximity switch while storing the initial state of the proximity switch until the toggling is successfully completed. Both the proximity switch position and the validity of the information are provided as outputs.

14 Claims, 2 Drawing Sheets

AUTOMATIC TESTING OF POSITION SENSING DEVICES EMPLOYING STORED SENSED POSITION

BACKGROUND OF THE INVENTION

The present invention relates to a method and apparatus for testing proximity switches and particularly to such method and apparatus which continuously tests proximity switches by external means.

Proximity switches are used for a variety of checking functions including determination of when and if a particular physical movement has taken place. Sensing devices of this type are used in aircraft control systems to detect door positions, landing gear extension and retraction, wing leading edge slats and flaps position, and air/ground sensing. The proximity switch is ordinarily mounted on a fixed structure and senses the approach of a target, the latter comprising a small piece of metal mounted on a movable component.

Typical maintenance procedure involves physically altering or obstructing the proximity switch/target relationship or manually operating the switch and checking system response. Some aircraft include a microprocessor-controlled tester which can initiate a checking routine if an abnormal target position is indicated. However, some malfunctions may never be detected, and even when an abnormal situation is suspected the checking routine results in nuisance interruptions in the proximity switch output and in the circuit functions controlled thereby.

In a proximity system described in Buck et al U.S. Pat. No. 4,525,699, a proximity circuit is provided with an internally applied test signal superimposed on the regular switch output. This test signal is extracted from the switch output to determine whether the circuit is operating properly. A specialized proximity switch and responsive circuitry is required and the checking function is not applicable to conventional or already existing proximity switches.

SUMMARY OF THE INVENTION

In accordance with the present invention in a preferred embodiment thereof, the present state of a proximity switch is sensed or detected and stored for providing a continuing output to circuitry normally receiving the output of the proximity switch. A test input is then applied to the proximity switch for cycling the switch from the said present state to a second and opposite state. Upon removal of the testing input, and assuming the condition to which the proximity switch is intended to be responsive has not changed, the proximity switch will return to its initial state. The proper cycling of the proximity switch is detected and a test output indicative of successful cycling is provided, whereupon the present switch state is once again supplied as the proximity switch output. The testing input and the concurrent storing of present state output occur on a periodic basis to provide substantially continuous test cycling without observable interruption of conventional proximity switch output.

According to the method and apparatus of the present invention, the proximity switch cycles through its normal functions and virtually any operational failure of the switch will be detected. The testing input and output are applied externally such that the present system is applicable to existing proximity switches. Moreover, removal of the testing system itself will not prevent operation of the proximity switch tested.

According to a particular embodiment of the present invention, cycling of the proximity switch is begun by determining the present state of the proximity switch whereby the switch is then toggled to the second and opposite state before returning to the initial state.

It is accordingly an object of the present invention to provide an improved method and apparatus for testing a position sensing switch which does not interfere with normal switch output.

It is another object of the present invention to provide an improved method and apparatus for automatically testing a position sensing switch on a substantially continuous basis without requiring alteration of the normal switch circuitry or functions.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

Drawings

FIG. 1 is a block diagram of a system employing a plurality of proximity switches; and FIG. 2 is a schematic diagram of a proximity switch testing circuit in accordance with the present invention.

DETAILED DESCRIPTION

Figure 1:
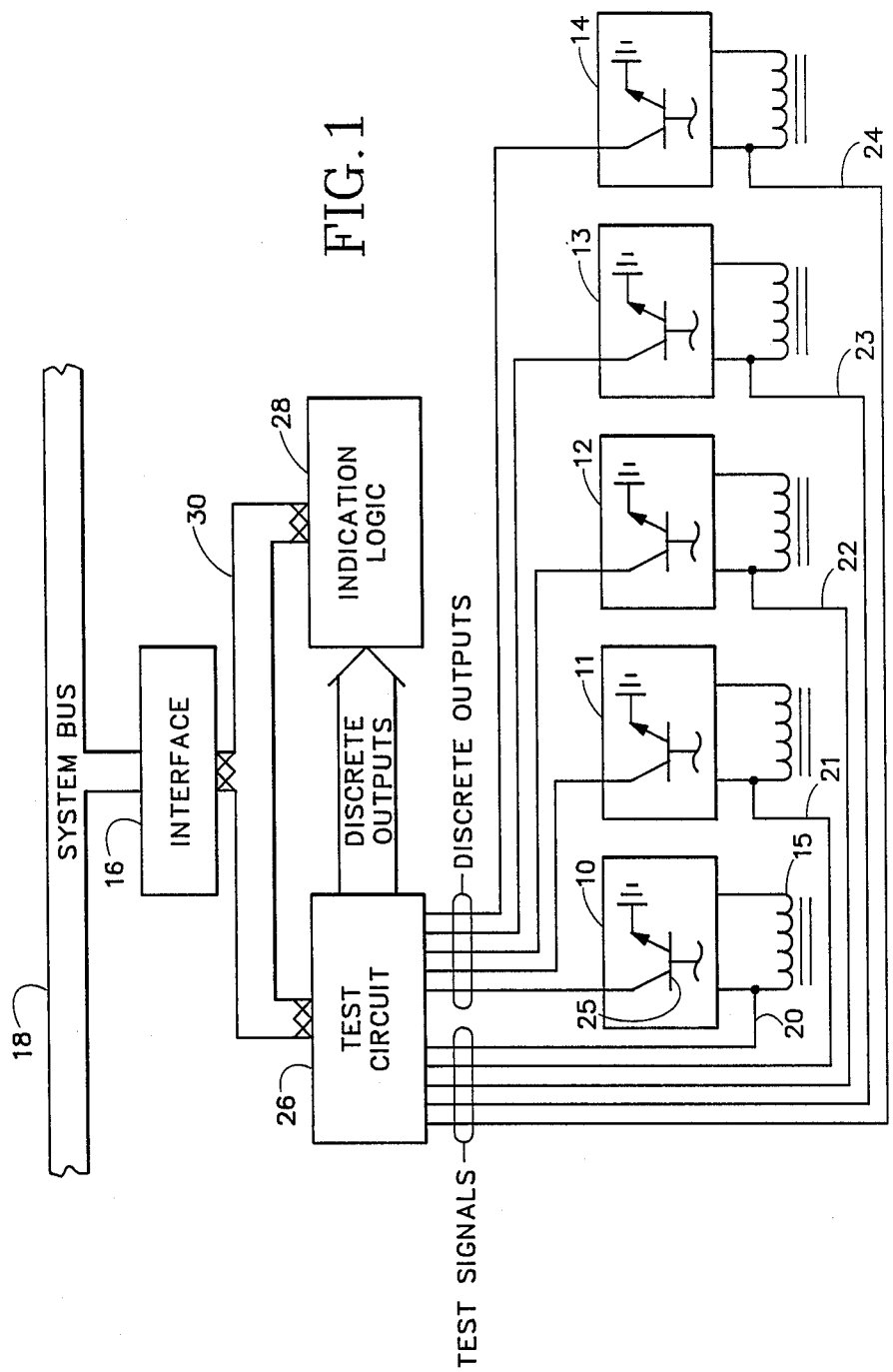

Referring to the drawings and particularly to FIG. 1, an indication system is illustrated as may be incorporated in a large aircraft for ascertaining the physical position of certain movable structures such as doors, landing gear, flaps and the like. It may be desirable to sense several conditions associated with a single structure such as landing gear locked in an up position and landing gear locked in a down position. A plurality of proximity switches, 10–14 in FIG. 1, may be mounted close to one another in general location and are serviced by the same interface unit 16 connected to system bus 18 wherein the latter is multiplexed to provide a number of different data functions. Each of the proximity switches, for example a proximity switch 10, is provided with a sensing coil 15 for detecting the approach of an appropriate target (not shown) on physical structure, resulting in operation of transistor 25 to provide a closed circuit to ground when the target comes within predetermined range. Proximity switches of this kind are known in the art and may each comprise a model 8-060-02 circuit provided with a model 1-899-15 sensor, both manufactured by Eldec Corporation of Lynnwood, Wash. In accordance with the present invention, test circuit 26 generates test signals on leads 20–24 connected to end terminals of sensor coils 15 forming part of proximity switches 10–14 respectively. The proximity switches 10–14, either in response to physical movement influencing a corresponding coil 15 or in response to an input on a corresponding lead 20–24, each provide an appropriate proximity switch output at the collector of a transistor 25 coupled to supply such output to test circuit 26. Outputs representing target position are supplied to indication logic 28 and the status of these discrete outputs is periodically interrogated via local bus means 30 connecting indication logic 28 to interface 16.

Test circuit 26 periodically cycles each of the proximity switches 10-14, through application of test signals on leads 20-24, and supplies corresponding test results via local bus means 30 to interface 16. The test result indicates whether a proximity switch has been successfully toggled by the last test signal. The system bus 18 is thereby provided not only with substantially continuous information regarding the proximity switch outputs, but is also provided with substantially continuous information regarding the functionality of the proximity switches. As subsequently disclosed with reference FIG. 2, while a proximity switch is being toggled, its just previous status is temporarily stored and supplied as a proximity switch status output whereby no interruption occurs in the information supplied to indication logic 28.

The system bus 18, interface 16, indication logic 28 and local bus 30 are not part of a present invention, it being understood the foregoing information is provided for explanatory purposes. The test method and apparatus in accordance with the present invention may be employed separately or integrated in a system via other interconnection means.

Figure 2:
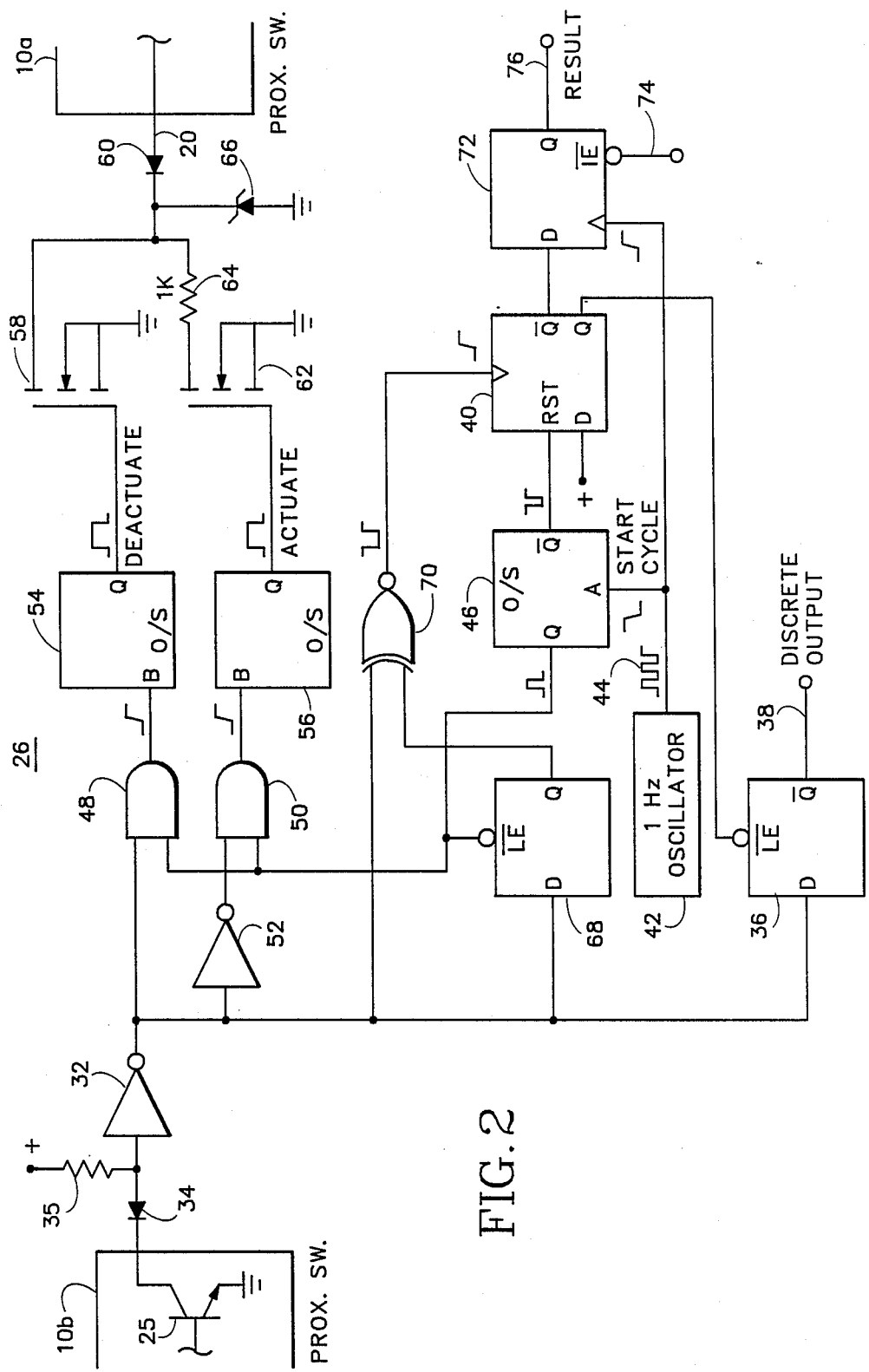

Referring to FIG. 2 illustrating test circuit 26 in greater detail insofar as it relates to a proximity switch 10, proximity switch output transistor 25 in output portion 10b of the switch is characterized by full conduction when the switch is "actuated", and presents a substantial open circuit at its collector when "deactuated". The collector terminal is coupled to the input inverter 32 by way of diode 34 having its cathode connected to the collector of the transistor, the anode of diode 34 being returned to a positive voltage through pull up resistor 35. Thus when transistor 25 conducts, indicating switch actuation, the input of inverter 32 is near ground level and when transistor 25 ceases conduction, a positive voltage is applied at the input of the inverter.

Latching circuit 36 receives the output of inverter 32 and normally supplies such output in inverted form at its $\overline{Q}$ terminal as the discrete output of the test circuit for this particular proximity switch. Latching circuit 36 which suitably comprises one half of a type HC 75 latch will hold its D input when the Q output of D flip-flop 40 goes low to couple a latch enable input to latching circuit 36. As will hereinafter become more evident, when the test circuit 26 toggles or cycles the proximity switch 10, the "present" or "initial" state thereof, as represented by the output of inverter 32, is held by latching circuit 36 and provided as the discrete output for the proximity switch until the toggling is complete, whereupon the latching circuit is returned to its initial condition of passing the output of inverter 32 to lead 38.

A means for generating periodic timing pulses in a particular embodiment comprises a 1 Hertz oscillator 42 producing a square wave output 44 applied to start cycle one shot circuit 46. Each time the square wave output 44 from oscillator 42 goes low, one shot 46 generates positive going and negative going pulses of short duration at its Q and $\overline{Q}$ outputs. The Q output of start cycle one shot 46 is coupled as an input to AND gates 48 and 50 forming part of toggle directing means according to the present invention. The purpose of the toggle directing means is to ascertain the initial state of switch 10 and thereby determine the identity of the second and opposite state to which the switch is to be toggled. AND gate 48 receives the output of input inverter 32 directly, while AND gate 50 receives such output through a second inverter 52. AND gate 48 drives one shot pulse generator 54 and AND gate 50 drives one shot pulse generator 56. The one shot pulse generators 54 and 56 comprise means for applying a test input to the switch for cycling the switch from its initial state to a second state and return.

It will be observed that if proximity switch 10 is in an actuated condition, i.e., if transistor 25 is conducting, the resulting high output from inverter 32, in conjunction with the Q output of one shot 46, operates AND gate 48 causing one shot pulse generator 54 to supply an output pulse at its Q output terminal, here labeled "Deactuate". The Deactuate pulse is applied to the gate of switching MOS transistor 58 having its drain connected to test lead 20 through diode 60, the cathode of diode 60 being connected to the transistor drain. The substrate and source of transistor 58 are returned to ground. As will hereinafter become more evident, the Deactuate pulse, which causes conduction through transistor 58 to ground, has the effect of toggling the proximity switch 10 from its actuated condition to its deactuated condition. After conclusion of the Deactuate pulse output of one shot circuit 54, the proximity switch will return to its actuated condition assuming the switch 10 target has not meanwhile moved out of actuating range. The proximity switch has thus been toggled from actuated condition to deactuated condition and back again.

If, on the other hand, the proximity switch 10 is initially in its deactuated state, then the output of inverter 32 will be low but the resulting output of inverter 52 will be high for supplying an input to AND gate 50 in conjunction with the Q output of one shot circuit 46. As a consequence, one shot pulse generator 56 will provide the "Actuate" pulse at its Q output causing switching MOS transistor 62 to return lead 20 to ground through diode 60 and 1 K resistor 64. Transistor 62 has its gate connected to the Q output of pulse generator 56 and its drain connected to resistor 64, while the substrate and source of transistor 62 are returned to ground. Presenting the foregoing impedance to ground at test lead 20 has the effect of toggling the proximity switch from the deactuated condition to the actuated condition. After the conclusion of the Actuate pulse output from one shot pulse generator 56, the proximity switch will return to its deactuated state, assuming the target has not otherwise affected the switch in the meantime.

Zener diode 66 is inserted between the outputs of the switching transistors and ground to protect the transistors from transient voltage. In addition, diode 60 is interposed between the drains of the MOS transistors and lead 20 to prevent the waveform generated within the proximity switch from forward biasing the gate-drain junctions of the transistors.

Proximity switch 10 typically includes an oscillator driven bridge circuit having sensor coil 15 (see FIG. 1) in one leg of the bridge. The approach of the target to the sensing coil effectively changes the reluctance of the coil for unbalancing the bridge and switching transistor 25. Shorting the manufacturer's designated manual test point (at one end of the sensor coil) substantially to ground causes a "deactuated" state to be effected. However, returning the same test point to ground through transistor 62 in series with resistor 64 causes the proximity switch to assume an "actuated" condition.

It will be seen that upon the occurrence of the positive pulse output from start cycle one shot 46, the proximity switch will be cycled from the deactuated condition to the actuated condition if it is initially in the deactuated condition, and will be cycled from the actuated condition to the deactuated condition if it is initially in the actuated condition. After toggling in a first direction, the switch will normally return to its initial state.

At the same time the positive going pulse at the Q output of one shot circuit 46 is applied to AND gates 48 and 50, the negative going pulse at the $\overline{Q}$ output of circuit 46 is applied to the reset input of D flip-flop 40 having its D input returned to a positive potential. At this time the Q output of flip-flop 40 goes low for providing the latch enable input of latching circuit 36. Thus, during toggling of the proximity switch from its initial condition to the opposite condition and back, latching circuit 36 will cause the initial switch state to be represented on output lead 38.

Means are provided for detecting the completion of toggling of the switch from a present state to the opposite state and back, including a second latching circuit 68 also receiving its D input from inverter 32 and also suitably comprising half of an HC 75 latch. During the positive going Q output of start cycle one shot 46, circuit 68 is "unlatched" and provides its D input at its Q output. At this time, therefore, exclusive NOR gate 70, coupled to receive the output of inverter 32 and the Q output of latching circuit 68, produces a high output, since both of its inputs are the same. At the conclusion of the Q output pulse of start cycle one shot 46, latching circuit 68 stores the initial or present state of the proximity switch. The output pulses of start cycle one shot 46 are quite short, e.g., on the order of 100 nanoseconds, and consequently proximity switch 10 will not have toggled from its initial state to its opposite state at the conclusion of the Q output from one shot 46. However, when the toggling of proximity switch 10 is complete from its initial state to its opposite state, the input of XNOR gate 70 from inverter 32 will differ from the input provided at the Q terminal of latching circuit 68 and consequently XNOR gate 70 will produce a low output. When the proximity switch 10 has toggled from its initial state to its opposite state, and has been returned to its initial state, both inputs to XNOR gate 70 will again be the same and the negative going output will conclude, setting D flip-flop 40. The output of XNOR gate 70 is applied as the clock input of D flip-flop 40, but the latter will be clocked by only the positive going portion of the XNOR gate output. It will be recalled that D flip-flop 40 was reset by the $\overline{Q}$ output of start cycle one shot 46, and will not be set until the conclusion of the negative going output pulse from XNOR gate 70. At this time, the Q output of flip-flop 40 will go high, ending the latching period of latching circuit 36 whereby output 38 will return to the actual output for proximity switch 10 as dictated by its target.

When flip-flop 40 was reset by the $\overline{Q}$ output of one shot 46, the $\overline{Q}$ of flip-flop 40 was preliminarily set high for indicating a failed condition of proximity switch 10. Only upon successful toggling of the proximity switch will the $\overline{Q}$ output of flip-flop 40 be set to zero for indicating proper operation of switch 10.

To ensure that a valid test result is provided when the test circuit is read, the output of flip-flop 40 is coupled through a three-state D flip-flop 72. The rising edge of the oscillator 42 output following the falling edge that initiated operation of one shot 46 clocks the $\overline{Q}$ result from flip-flop 40 into three-state D flip-flop 72, and this three-state D flip-flop will always hold a valid result as long as the oscillator 42 output does not go high before the toggling cycle is complete. In a particular embodiment the entire cycle occupied approximately 90 milliseconds, thus completing long before the output of oscillator 42 goes high. The output of three-state D flip-flop 72 is enabled on lead 74 suitably provided by interface circuit 16 in FIG. 1. It should be noted that the duty cycle of oscillator 42 can be changed if desired so that data can be strobed in immediately after it is valid.

It will be seen that for the preponderance of the time discrete output 38 represents the present state of proximity switch 10. Periodically, however, the output 44 from oscillator 42 initiates a test cycle during which the state of the proximity switch at the beginning of the test cycle is held in latching circuit 36 and maintained as an output until the conclusion of the test cycle. If the proximity switch has passed the test, the discrete output is released and once again represents the instantaneous condition of the proximity switch. If the proximity switch has failed the test, the discrete output on lead 38 remains the same, but the test circuit will continue to test the failed switch and will release the discrete output if the switch subsequently passes the test. The test result is available to the system on lead 76 and is suitably interrogated by the supervisory system to determine the validity of the discrete output from the switch. It will be noted that any erroneous result that may arise if the target moves substantially from its original position during a test cycle will be immediately corrected by the next test cycle.

The apparatus and method according to the present invention provides checking of a proximity switch by external means that does not require replacement or restructuring of the existing proximity switch or responsive circuitry. The apparatus and method according to the present invention toggles the switch through its normal operation on a substantially continuous basis and provides evaluation of the correctness of the output without interfering with the conventionally detected proximity switch output. Virtually any operational failure of the switch will be detected. Moreover, removal of the test circuit will not prevent continued operation of the proximity switch tested.

While a portion of test circuit 26 for continuously testing one of a plurality of proximity switches has been illustrated and described, it is understood the circuit is substantially duplicated for the remaining switches of a group of switches in a given area and it will be readily understood that much of the circuitry can be shared between a plurality of switches.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for automatically testing a position sensing switch producing a continuous output signal of state indicating a position of an object, said method comprising:

sensing a present state of said output signal and storing said present state, temporarily providing a testing input to said switch of a state selected in response to the sensed present state of the output signal such that the test input causes said switch to temporarily change its output signal from said present state to a second state, and detecting the temporary change of state of said output signal and supplying a test output indicative of successful switch operation.

2. The method according to claim 1 including repetitively providing said testing input to said switch.

3. A method for automatically testing a position sensing switch adapted to provide a switch output indicative of the position sensed, said method comprising:

storing an initial present state of said switch and supplying the stored state as a substitute switch output, while said stored state is supplied as said substitute switch output, applying a testing input to said switch for cycling said switch from said present state to a second state, detecting the change in state of said switch and supplying a test output indicative of successful cycling, and returning said switch output to an indication of the position sensed.

4. The method according to claim 3 including repetitively providing said testing input to said switch.

5. The method according to claim 3 wherein said test output indicative of successful cycling is supplied when said switch has returned from said second state to the initial state.

6. The method according to claim 3 including providing a test output indicative of switch failure until successful cycling has been completed.

7. Apparatus for automatically testing a position sensing switch producing a continuous output signal of state indicating a position of an object, said apparatus comprising:

input means for sensing an initial state of said output signal, means for storing said initial state, means for temporarily applying a test input to said switch of a state selected in response to the sensed initial state of the output signal such that the test input causes said switch to temporarily change the state of its output signal from said initial state to a second state, means responsive to said input means for detecting state change of said output signal, and means responsive to said detection and for providing a test output.

8. The apparatus according to claim 7 wherein said means responsive to said detection comprises means for providing said test output upon return of said output signal from said second state to said initial state.

9. The apparatus according to claim 7 wherein said means for storing is operated for storing the said initial state when said test input is applied to said switch.

10. Apparatus for automatically testing a position sensing switch, said apparatus comprising:

input means for sensing an initial state of said switch, means for storing said initial state, means for applying a test input to said switch for cycling said switch from said initial state to a second state, means responsive to said input means for detecting state change of said switch, means responsive to said detection for providing a test output, and switch output means normally providing a present output of said switch, and providing a stored output from said means for storing when said test input is applied to said switch.

11. The apparatus according to claim 7 including further means coupled to said input means for ascertaining the initial state of said output signal to thereby determine the identity of said second state, said means for applying a test input being controlled by the said further means.

12. Apparatus for automatically testing a position sensing switch, said apparatus comprising:

input means for sensing an initial state of said switch, means for storing said initial state, means for applying a test input to said switch for cycling said switch from said initial state to a second state, means responsive to said input means for detecting state change of said switch, means responsive to said detection for providing a test output, and further means coupled to said input means for ascertaining the initial state of said switch to thereby determine the identity of said second state, said means for applying a test input being controlled by the said further means, wherein said further means comprises a pair of gates respectively responsive to opposite states of said switch, and wherein said means for applying a test input comprises a pair of pulses generating means controlled respectively by said gates and means for supplying oppositely actuating inputs to said switch when energized by outputs of respective pulse generating means, wherein a said gate responsive to a given state of said switch controls a pulse generating means to provide a pulse effective to place said switch temporarily in the opposite state.

13. Apparatus for automatically testing a position sensing switch, said apparatus comprising:

input means for sensing an initial state of said switch, means for storing said initial state, means for applying a test input to said switch for cycling said switch from said initial state to a second state, means responsive to said input means for detecting state change of said switch, and means responsive to said detection for providing a test output, wherein said means for detecting state change comprises an exclusive logic gate receiving as one input thereof an output of said input means, and further including a latching circuit for storing a just previous output of said input means to provide a second input for said exclusive logic gate.

14. Apparatus for automatically testing a position sensing switch, said apparatus comprising:

input means for sensing the initial state of said switch, means for generating periodic timing pulses, a latching circuit receiving state identification from said input means and normally providing said state identification as an output, while being responsive to a said timing pulse for providing an alternative latching condition wherein state identification is stored and supplied as said output, toggle directing means coupled to said input means for ascertaining the initial state of said switch and thereby determining the identity of a second and opposite state of said switch, said toggle directing means comprising a pair of AND gates respectively receiving inverted and non-inverted state inputs from said input means, said AND gates each having a second input responsive to said periodic timing pulses, means for applying a test input to said switch for cycling said switch from its initial state to a second state comprising a pair of pulse generating means controlled respectively by said AND gates and means for supplying oppositely actuating inputs to said switch as energized by outputs of the respective pulse generating means, wherein a said AND gate responsive to a given state of said switch controls a pulse generating means to provide a pulse effective for placing said switch temporarily in the opposite state, means coupled to said input means for detecting state change of said switch comprising a second latching circuit coupled to said input means for storing a state input pursuant to the occurrence of a said periodic timing pulse, and an exclusive logic gate receiving as one of its inputs an output of said input means and as another of its inputs an output of said second latching circuit, and means responsive to said means for detecting state change for providing a test output.

* * * * *

UNITED STATES PATENT AND TRADEMARK OFFICE
CERTIFICATE OF CORRECTION

PATENT NO. : 4,845,475
DATED : July 4, 1989
INVENTOR(S) : Joseph T. Cooledge and Thanh J. Gahr It is certified that error appears in the above-identified patent and that said Letters Patent is hereby corrected as shown below:

Column 8, line 26, "pulses" should be --pulse--.

Signed and Sealed this

Third Day of April, 1990

*Attest:*

HARRY F. MANBECK, JR.

*Attesting Officer*  *Commissioner of Patents and Trademarks*